US012512062B1

United States Patent
(12) United States Patent
Seo et al.

(10) Patent No.: US 12,512,062 B1
(45) Date of Patent: Dec. 30, 2025

(54) APPARATUSES, SYSTEMS, AND METHODS FOR ACTIVE-MATRIX ORGANIC LIGHT EMITTING DIODE (AMOLED) PIXEL DRIVING ARCHITECTURES

(71) Applicant: KOPIN CORPORATION, Westborough, MA (US)

(72) Inventors: Yongseok Seo, Palo Alto, CA (US); Jinkuk Kim, San Jose, CA (US); Seungyoub Kim, Fremont, CA (US); Jangho Kim, San Jose, CA (US)

(73) Assignee: KOPIN CORPORATION, Westborough, MA (US)

( * ) Notice: Subject to any disclaimer, the term of this patent is extended or adjusted under 35 U.S.C. 154(b) by 0 days.

(21) Appl. No.: 18/094,965

(22) Filed: Jan. 9, 2023

Related U.S. Application Data

(60) Provisional application No. 63/298,166, filed on Jan. 10, 2022.

(51) Int. Cl.

| | |
|---|---|
| ***G09G 3/32*** | (2016.01) |
| ***G09G 3/3258*** | (2016.01) |
| *H10K 59/12* | (2023.01) |

(52) U.S. Cl.
CPC ... *G09G 3/3258* (2013.01); *G09G 2300/0814* (2013.01); *G09G 2300/0819* (2013.01); *G09G 2300/0842* (2013.01); *G09G 2320/0233* (2013.01); *G09G 2320/041* (2013.01); *G09G 2320/066* (2013.01); *G09G 2320/0693* (2013.01); *G09G 2360/147* (2013.01); *H10K 59/12* (2023.02)

(58) Field of Classification Search
CPC ......... G09G 3/3258; G09G 2300/0814; G09G 2300/0819; G09G 2300/0842; G09G 2320/0233; G09G 2320/041; G09G 2320/066; G09G 2320/0693; G09G 2360/147; H10K 59/12
See application file for complete search history.

(56) References Cited

U.S. PATENT DOCUMENTS

2010/0265228 A1* 10/2010 Kimura ............... G09G 3/3233 345/207

* cited by examiner

*Primary Examiner* — Michael A Faragalla
(74) *Attorney, Agent, or Firm* — PELOQUIN, PLLC; Mark S. Peloquin, Esq.

(57) ABSTRACT

Apparatuses, Method, and Systems are described that boost a brightness of an Organic Light Emitting Diode (OLED) pixel. A boost control signal is transmitted to the OLED pixel on a boost control line. The boost control signal is combined with a pixel data signal at a node within the OLED pixel to obtain a composite drive signal. The OLED pixel is driven with the composite drive signal. The composite drive signal is elevated by the boost control signal, thereby increasing a brightness of the OLED pixel. An OLED display is made from a plurality of OLED pixels.

22 Claims, 12 Drawing Sheets

APPARATUSES, SYSTEMS, AND METHODS FOR ACTIVE-MATRIX ORGANIC LIGHT EMITTING DIODE (AMOLED) PIXEL DRIVING ARCHITECTURES

RELATED APPLICATIONS

This patent application claims priority from United States Provisional Patent Application titled: "APPARATUSES, SYSTEMS, AND METHODS FOR ACTIVE-MATRIX ORGANIC LIGHT EMITTING DIODE (AMOLED) PIXEL DRIVING ARCHITECTURES," filed on Jan. 10, 2022, Ser. No. 63/298,166.

U.S. Provisional Patent Application Ser. No. 63/298,166 is hereby incorporated by reference

BACKGROUND OF THE INVENTION

1. Field of the Invention

The invention relates generally to displays and more specifically to active-matrix organic Light emitting diode (AMOLED) displays.

2. Art Background

AMOLED display technology is advancing at a rapid pace. In particular, development of high efficiency AMOLED materials as well as high throughput AMOLED deposition equipment has led to large scale commercialization of AMOLED displays. An Organic Light Emitting Diode (OLED) device has organic semiconductor layers that are situated between two electrodes, an anode and a cathode. The electrodes are typically made from inorganic materials. Holes and electrons are injected to the organic layers from the anode and cathode, respectively. When the electrons and holes recombine in the active organic layer, photons are emitted.

AMOLED displays range in size from large displays to micro-AMOLED displays which can be smaller than 1 inch in diagonal size. Micro-AMOLED displays typically have backplane integrated circuits fabricated on a single crystal Silicon (Si) substrate. Because of the high performance of Si transistors, a pixel size used to make a high-resolution display in a small size can be very small, typically equal to or less than 15 micrometer (μm). The backplane circuitry includes a pixel array, row/column drivers, video input, video processing, and programmable control.

Some applications of AMOLED displays require operation over a wide range of operating conditions such as a wide range of ambient light and operating temperature. In bright ambient light conditions, an AMOLED display might suffer from lack of brightness and contrast ratio degradation. This can present a problem.

FIG. 1 illustrates, generally at 100, an existing OLED pixel driving circuit. FIG. 2 illustrates, generally at 200, a timing diagram for the existing OLED circuit of FIG. 1. Existing attempts at maintaining adequate AMOLED display performance have been to reduce a common voltage at a cathode of an OLED, the voltage is illustrated in FIG. 1 as Vcom, indicated at 108. Referring to FIG. 1, in a typical active-matrix OLED display, a unit pixel may include transistors N1 110, N2 120, N3 130 and an organic light emitting diode (OLED) 102. A source 114 of N1 110 is connected to a power supply Vdd indicated at 116, which is a positive voltage. A drain 112 of N1 110 is connected to an anode 104 of the OLED 102. A cathode 106 of the OLED 102 is connected to Vcom 108, which can be a negative voltage. A gate 126 of N2 120 is connected to a Word Select (WS) line 140 to receive a gating control signal 138. A source 124 of N2 120 is connected to an input data voltage (V_Data) 128, and a drain 122 of N2 is connected to a gate 118 of N1 110 and a gate 134 of N3 130, this connection is represented by a node 136. The other terminal of N3 130 is connected to a second common voltage reference Vss 132. Vss 132 can be a negative voltage. Vss 132 can be at a different potential from Vcom 108 or the same potential depending on the details of a given pixel architecture.

FIG. 2 illustrates a timing diagram for voltage signals to each terminal of the OLED pixel circuit of FIG. 1. The gate 126 of the transistor N2 120 receives a select signal through the WS line 140 while its source 124 receives a voltage data signal (V_data) 128 through the V_DATA line 129. The voltage data signal V_data 128 is transmitted to the gate 118 of the transistor N1 110 when the transistor N2 120 is turned "ON" by the select signal 138. The capacitance of N1 110 (Cg_N1) and the capacitance of N3 130 (Cg_N3) are charged by V_data 128 (210 shown in FIG. 2) to V_stored_data 212 while WS 202 is turned "ON" for a period of time t 204 and maintain their voltages until the scan starts for the next frame. The voltage level of V_stored_data 212 produces a voltage Vg 142 at the gate 118 which turns "ON" the transistor N1 110 to generate a driving voltage Vd 144 through the transistor N1 110 to the anode 104 of the OLED 102. The driving voltage Vd 144 to the anode 104 of the OLED 102 is equal to Vstored_data−Vth, indicated at 214, where Vth is the threshold voltage of N1 110. The voltage across the OLED 102 is Vstored_data−Vth−Vcom. Prior attempts to increase a drive voltage across the OLED 102 have been directed to lowering Vcom 108, for example by making Vcom 108 more negative. However, there is a limit to how much Vcom can be reduced before the OLED is biased above its turn-on voltage even at the lowest V_data value. Using a Vcom lower than this limit causes the OLED to emit light at the lowest V_data value, which will reduce the contrast ratio. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense.

In various embodiments, apparatuses, methods, and systems are described to boost a brightness of an AMOLED display while not decreasing a contrast ratio of the display. In various embodiments, apparatuses, methods, and systems are described to stabilize a brightness of an AMOLED display as a function of temperature while not decreasing a contrast ratio of the display. The terms AMOLED and OLED are sometimes used interchangeably throughout this description of embodiments.

As used in this description of embodiments, display and micro-display are to be afforded a broad meaning and can be used interchangeably. Note that embodiments of the invention are applicable to displays of various sizes including micro-displays of 1.5 inch or less as measured across a diagonal of the display to large flat panel displays measuring multiple feet or meters across a diagonal of the display. Thus, embodiments of the invention are applicable to displays of any size. Also, as used in this description of embodiments, it will be understood that a pixel of an AMOLED display can be made from multiple subpixels, where each subpixel is used to contribute a separate color of light to the pixel. In addition, one or more OLED pixels will be described in the figures that follow for clarity in the illustrations, however it will be understood that such descriptions extend to an entire display having many display pixels configured in a row and many rows configured to provide displays having a general number of m rows and n columns of OLED display elements on which images are provided to a user.

As used in this description of embodiments, the terms “information,” “signals,” and “voltages” flexibly refer to parameters that are used to produce different levels of brightness from a pixel. Some non-limiting examples of such terms are, but are not limited to, pixel drive information, a voltage or a current, an integer value in an array of values that correspond with voltage, current, etc. that are used to provide different brightness values from a pixel or a display made from an array of pixels.

Figure 3:
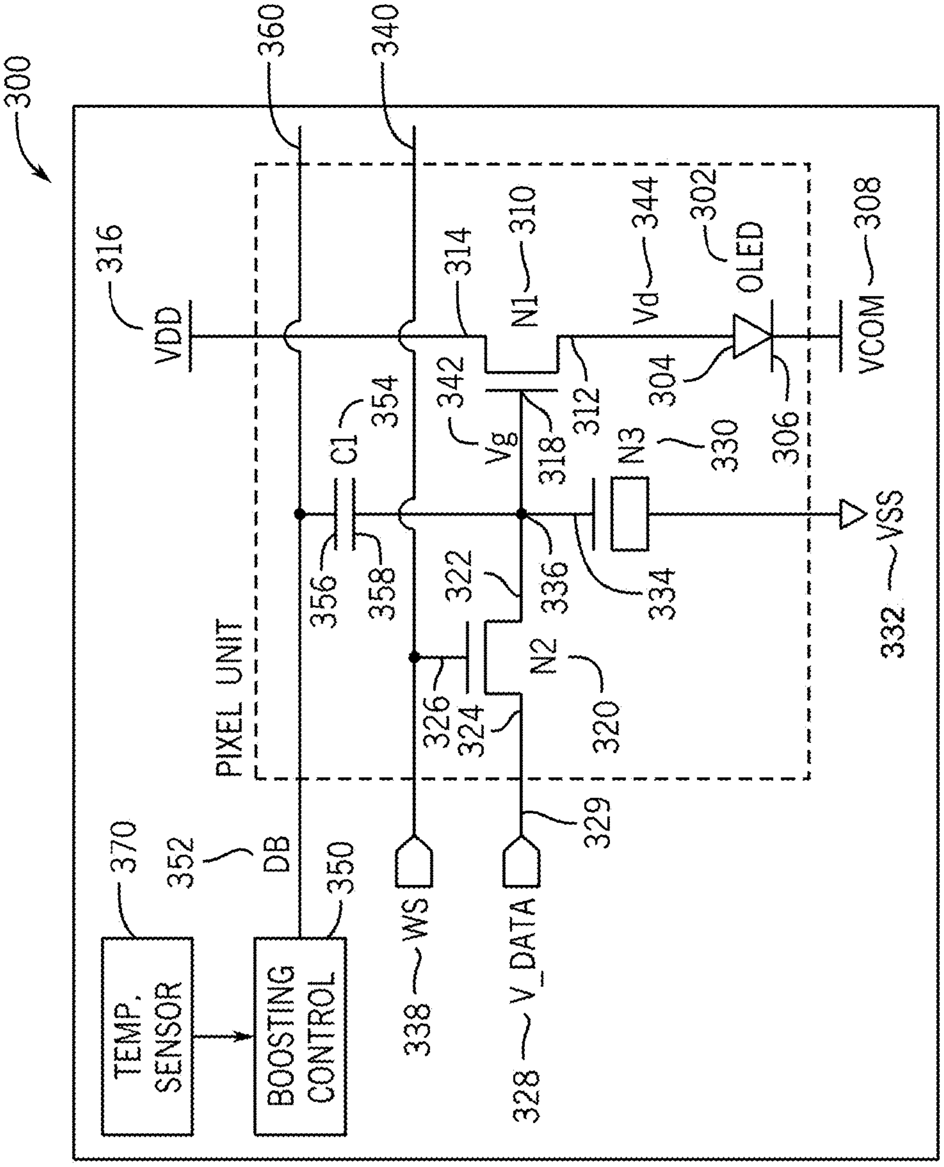
FIG. 3 illustrates an OLED pixel driving circuit, according to embodiments of the invention.

FIG. 3 illustrates, generally at 300, an OLED pixel driving circuit, according to embodiments of the invention. With reference to FIG. 3, a unit pixel circuit OLED pixel is illustrated. The term “unit pixel” is used herein to describe a single pixel which is representative of a display that is made from a plurality of such unit pixels extending generally in two dimensions referred to as rows and column. Thus, the term “unit pixel” is used in this description of embodiments for illustration and no limitation is implied thereby. In various embodiments, a unit pixel includes a first transistor N1 310, a second transistor N2 320, a third transistor N3 330, an OLED 302, and a voltage adjusting module configured to provide a compensation voltage to the gate 318 of N1 310, wherein the voltage adjusting module includes a first capacitor C1 354, with a first electrode plate 358 of the first capacitor C1 354 connected to a gate 318 voltage terminal of the first transistor N1 310, and a second electrode plate 356 of the first capacitor C1 354 is connected to a boosting control signal DB 352.

A source 314 of the first transistor N1 310 is connected to a power supply Vdd 316, the gate 318 of the first transistor N1 310 serves as the control terminal of the voltage adjusting module, and a drain 312 of the first transistor N1 310 is connected to an anode 304 of the OLED 302. A cathode 306 of the OLED 302 is connected to a common voltage Vcom 308. A gate 326 of the second transistor N2 320 is connected to a Word Select (WS) line 340 to receive the gating control signal 338, a source 324 of the second transistor N2 320 is connected to an input data voltage (V_Data) 328, and a drain 322 of the second transistor N2 320 is connected to the gate 318 of the first transistor N1 310 and a gate 334 of the third transistor N3 320. The mutual connection of the drain 322, the gate 318, the gate 334, and the first electrode plate 358 are indicated by a node 336 for clarity in the figure.

A boosting control signal DB 352 on the boost control line 360 from the boost control unit 350 is used to adjust the voltage to the gate 318 of the first transistor N1 310, which can adjust a brightness level and a contrast ratio of the OLED 302. Optionally, in some embodiments, the boost control unit 350 can be connected to a temperature sensor 370 so that the boosting control signal DB 352 can be adjusted by temperature variations, thereby providing temperature compensation to a display using a plurality of unit pixels. Temperature compensation minimizes a brightness variation of an OLED as a function of temperature.

Transistors N1 310, N2, 320, and N3 330 can be thin film transistors manufactured with semi-conductor manufacturing processes that are known to those of ordinary skill in the art. The third transistor N3 330 as illustrated has its source and drain tied together and functions as a storage element. The third transistor N3 330 can be referred to as a storage element and could be replaced by a capacitor in alternative embodiments, no limitation is implied by the use of the third transistor N3 330 herein for the storage element. The first transistor N1 310 is equivalently referred to herein as a drive transistor. The second transistor N2 320 is equivalently referred to herein as a control transistor. The other terminal of N3 330 is connected to a second common voltage reference Vss 332. Vss 332 can be a negative voltage. Vss 332 can be at a different potential from Vcom 308 or the same potential depending on the details of a given pixel architecture.

Figure 4A:
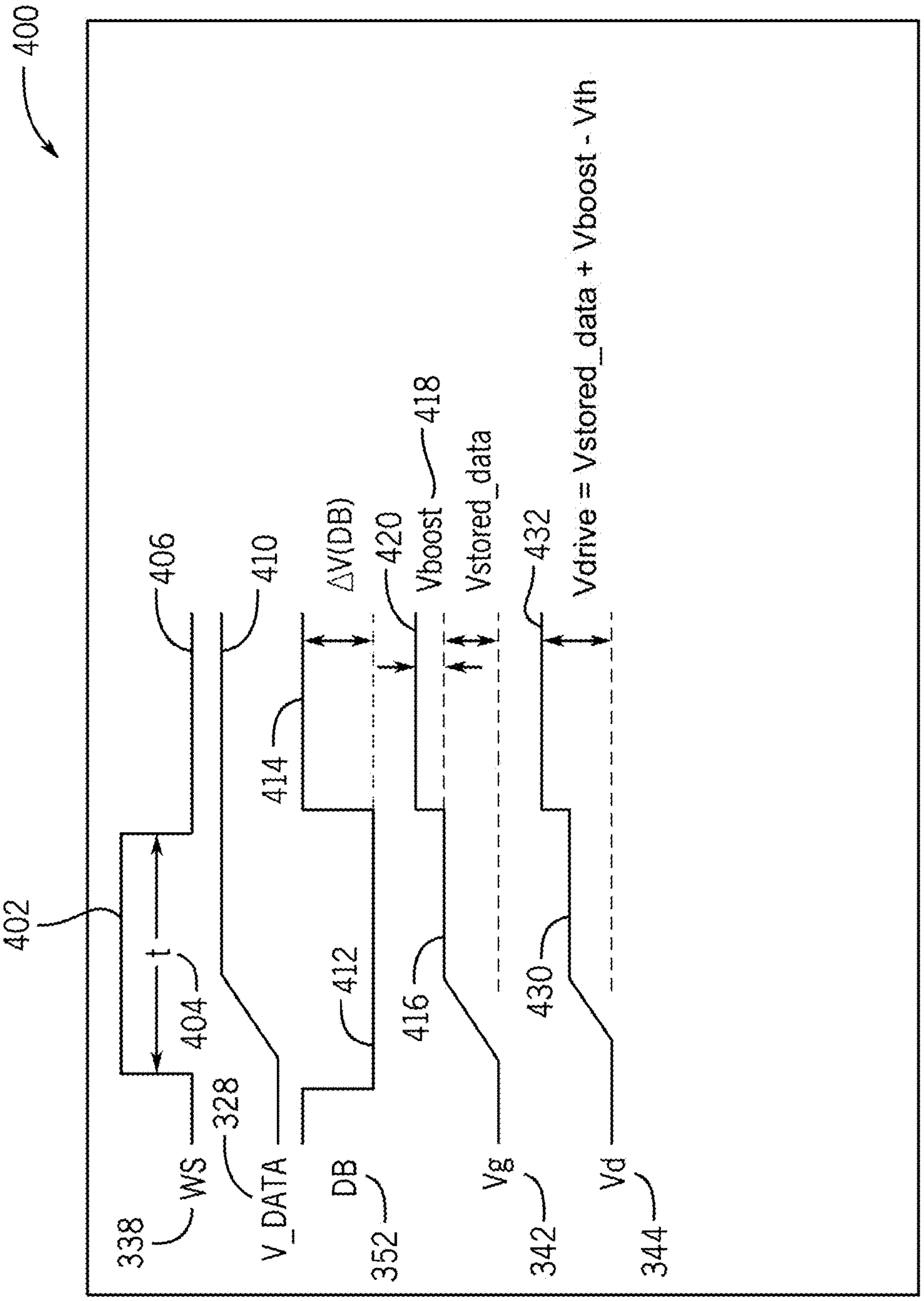
FIG. 4A illustrates a timing diagram for the OLED circuit of FIG. 3, according embodiments of the invention.

FIG. 4A illustrates, generally at 400, a timing diagram for the AMOLED circuit of FIG. 3, according to embodiments of the invention. With reference to FIG. 4A an operating example is described. The gate 326 of the second N2 320 receives a select signal 338 through the WS line 340 while its source 324 receives a voltage data signal V_data 328 through the DATA line 329. The voltage data signal V_data 328 is transmitted to the gate 318 of the drive transistor N1 310 when the control transistor N2 320 is turned “ON” by the select signal WS 338 going high at 402 for a period of time t at 404. The gate capacitances of N1 310 and N3 330 are charged by an amplitude of V_data 410 to V_stored_data 416 while WS is turned “ON” as indicated by the period of time t at 404. After turning “OFF” the second transistor N2

320 when the WS signal goes low at 406, the boosting voltage ΔV(DB) is turned "ON" at amplitude 414. The voltage Vboost 418 is added to the first electrode plate 358 of the first capacitor C1 354 and the gate 318 of the first transistor N1 310 (node 336).

Figure 4B:
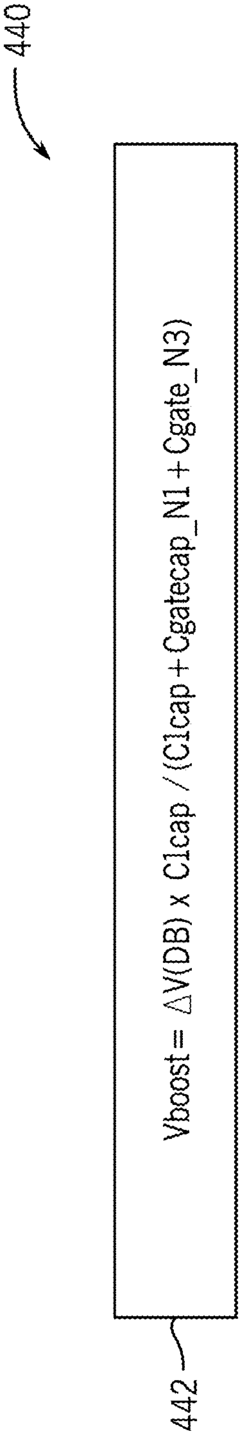
FIG. 4B illustrates, an equation for a boost voltage, according to embodiments of the invention.

FIG. 4B illustrates, generally at 440, an equation for a boost voltage (Vboost), according to embodiments of the invention. In one or more embodiments, equation 442 provides a relationship for boost voltage as follows: $Vboost=\Delta V(DB)\times C1cap/(C1cap+Cgatecap\_N1+Cgate\_N3)$, where C1cap is the capacitance of the first capacitor C1 354; Cgatecap_N1 is the capacitance of the gate of the first transistor N1 310; and Cgate_N3 is the capacitance of the gate of third transistor N3 330. In various embodiments, ΔV(DB) is established through measurements of display brightness. For example, in one or more embodiments, ΔV(DB) is adjusted until a target value for display brightness is obtained. A series of ΔV(DB) values can be obtained through this process, where each ΔV(DB) value corresponds to a different value of display brightness (luminance).

Figure 4C:
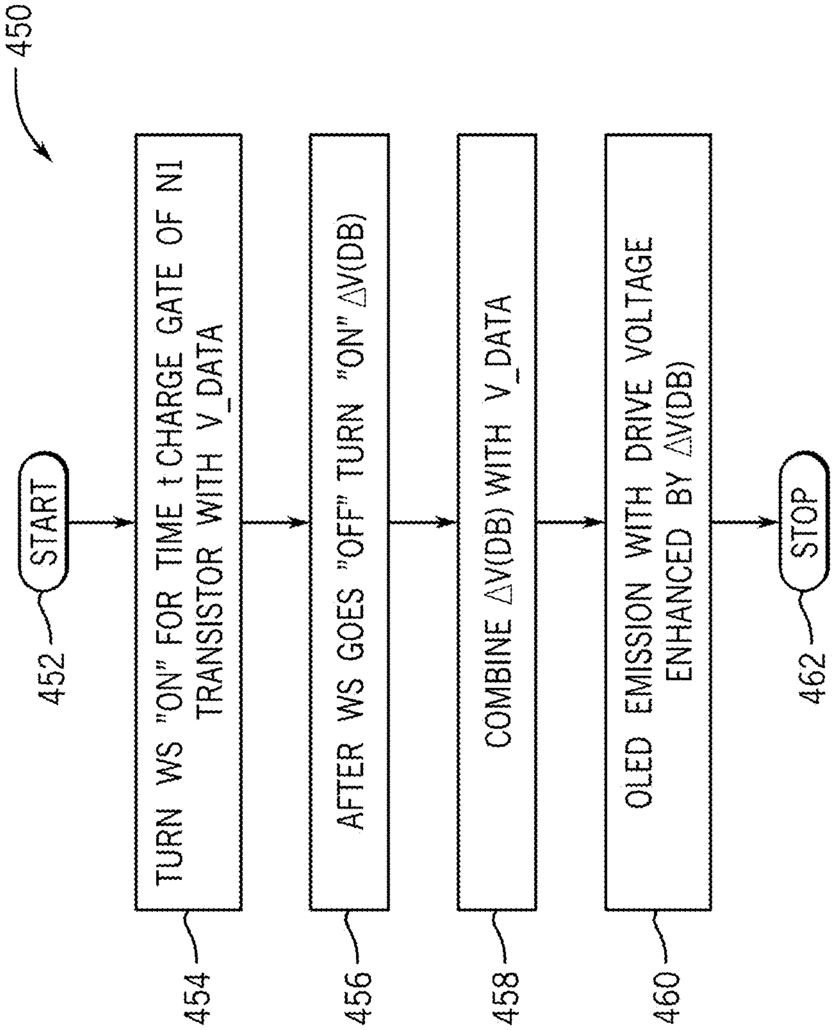
FIG. 4C illustrates, a method of operation for a modified OLED pixel, according to embodiments of the invention.

FIG. 4C illustrates, generally at 450, a method of operation for a modified OLED pixel, according to embodiments of the invention. Referring now to FIG. 3, FIG. 4A, FIG. 4B, and FIG. 4C a process starts at a block 452. At a block 454 display logic for an OLED display causes a select signal WS 338 on the word line 340 to go high, in other words the select signal transitions to the "ON" state, this transition places a voltage on the gate 326 of the control transistor N2 320, which permits pixel data 328 to be asserted on the gate 318 of the drive transistor N1 310. The select signal WS 338 stays high for time t as shown at 404 (FIG. 4A) and then goes low, in other words transitions to an "OFF" state. At a block 456 after the select signal WS goes low, the boost control unit 350 transitions to an "ON" state thereby placing a voltage ΔV(DB) 414 on the boost control line 360. At a block 458 Vboost is added to the voltage 416 (resulting from pixel data), this addition of Vboost, elevates the voltage asserted at node 336 and similarly on the gate 318 of the drive transistor N1 310. Drive voltage Vd 344 is applied to the OLED 302. With the addition of Vboost 418 a magnitude of drive voltage 344 is increased from a level 430 to a higher level 432 in the example of FIG. 4A. The enhanced drive voltage 432 permits a larger emission of light from the OLED for the given pixel data value represented by 410. The process stops at a block 462.

Figure 5:
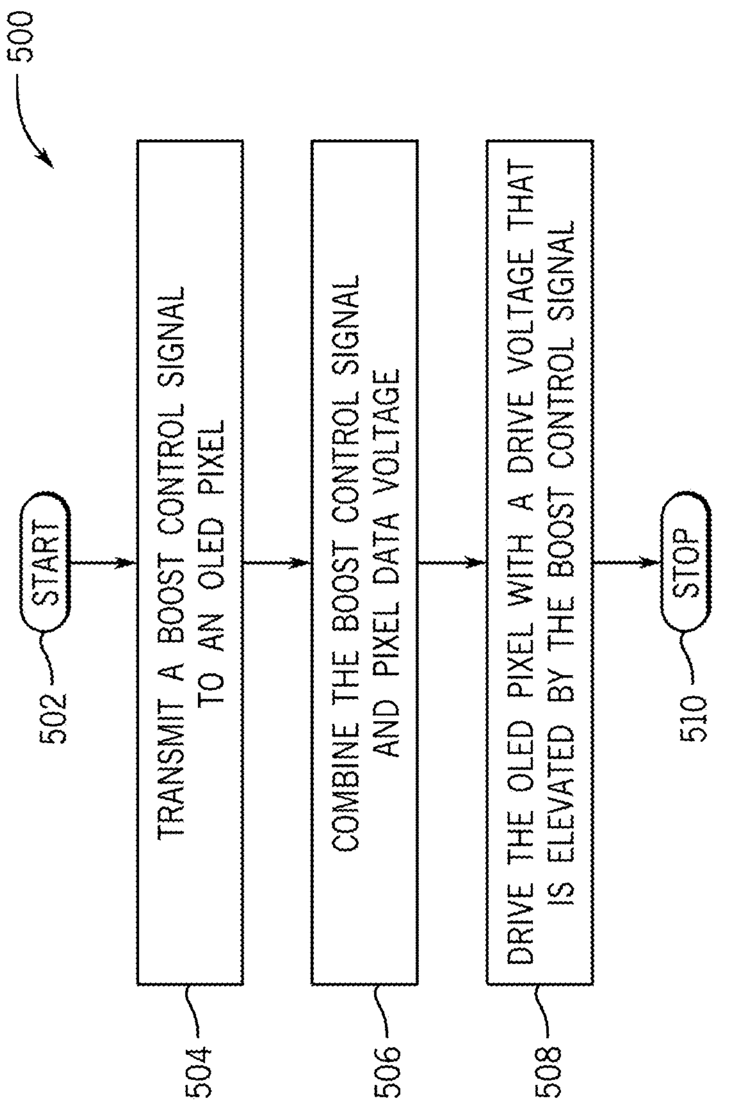
FIG. 5 illustrates a process for improving pixel performance according to embodiments of the invention.

FIG. 5 illustrates, generally at 500, a process for improving pixel performance according to embodiments of the invention. Referring to FIG. 5, a process starts at a block 502. At a block 504 a boost control signal is transmitted to an OLED pixel. The OLED pixel can be one of a plurality of such OLED pixels making up an OLED display. At a block 506 the boost control signal combines with a pixel data signal resulting in a modified pixel data signal. In one or more embodiments, the boost control signal combines additively with the pixel data signal. An example of this addition is represented in the addition of voltages shown in the equation for drive voltage (Vdrive), where: $Vdrive=(Vstored\_data+Vboost-Vth)$ see 432 in FIG. 4A. Where Vth is the threshold voltage required to turn "ON" a drive transistor, such as the drive transistor N1 310. At a block 508 the modified pixel data signal is used to drive the OLED. The OLED pixel is brighter that it would have been absent the boost control signal. As described herein a methodology is presented that permits a luminance output of a display, also referred to as display brightness, to be controlled apart from pixel data values or adjustment of Vcom.

Figure 6A:
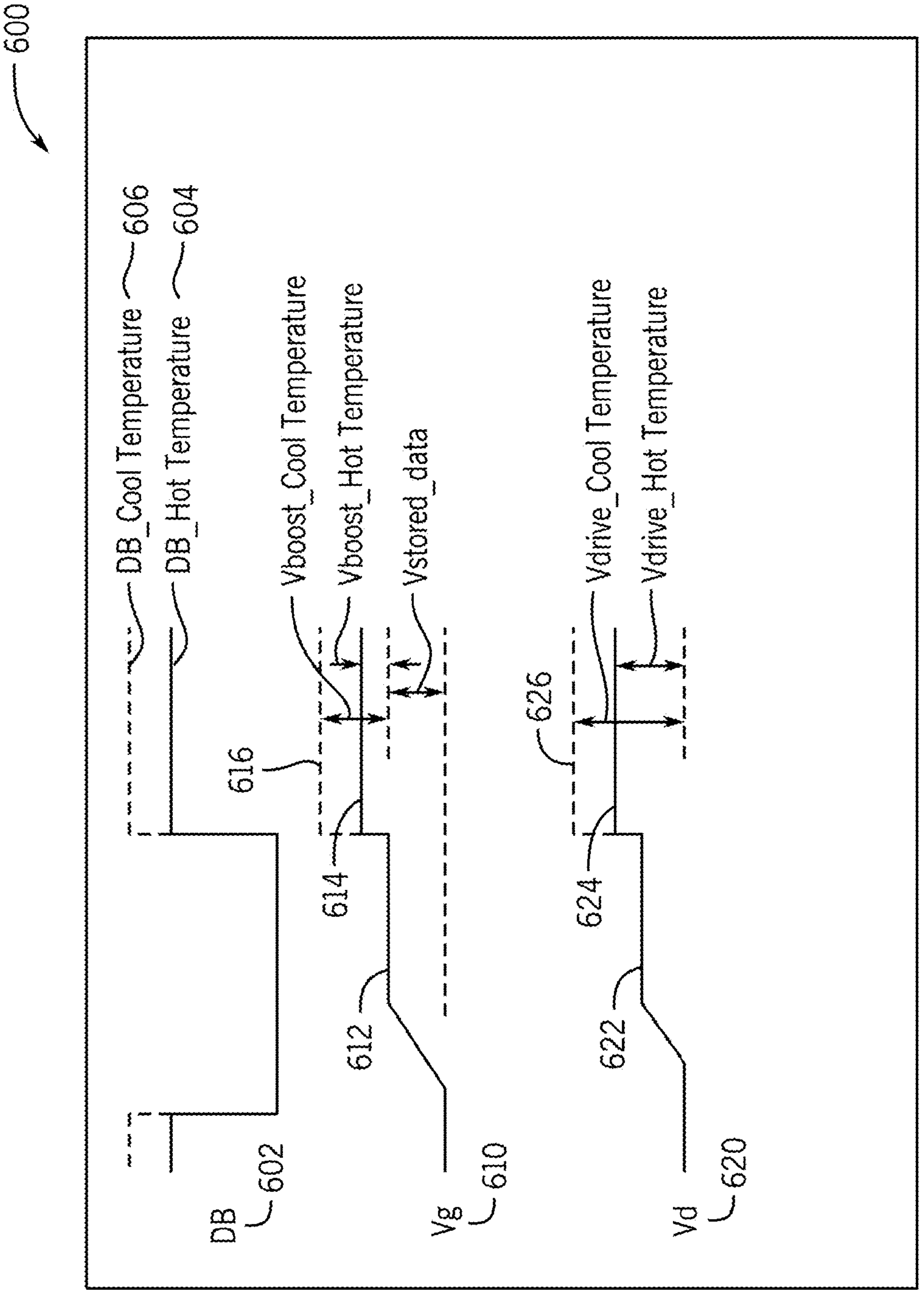
FIG. 6A illustrates temperature compensation, according to embodiments of the invention.

FIG. 6A illustrates, generally at 660, temperature compensation, according to embodiments of the invention. With reference to FIG. 6A, an operating example of adjusting the boosting voltage to reduce or eliminate temperature variation of OLED brightness is described for one or more embodiments. OLED displays typically exhibit a luminance output that decreases with decreasing environmental temperature. With the use of a temperature sensor, such as temperature sensor 370 in FIG. 3, to adjust ΔV(DB), the drive voltage of the OLED is increased at lower temperature and decreased at higher temperature. The described compensation assumes that OLED emission decreases with decreasing temperature. Alternatively, a different relationship between OLED display luminance and temperature can be corrected by applying the principles described herein to the different relationship.

As a qualitative example, and with no limitation implied thereby, boost signal DB is plotted at 602 for two different temperatures to illustrate temperature compensation of display output luminance. A boost signal for a hot temperature T1 is plotted at 604. A boost signal for a cooler temperature T2 is plotted as 606. Here $T2<T1$. Gate voltage Vg asserted on the drive transistor for an OLED pixel is plotted at 610. A voltage amplitude 612 represents the gate voltage on the drive transistor developed from a value of pixel data represented generally as Vstored_data. At the higher temperature T1, the lower boost voltage 604 is applied and combines with the voltage amplitude 612 to produce voltage 614. At the lower temperature T2 a larger boost voltage is required to maintain the same display luminance. Therefore, at the cooler temperature T2, the boost voltage 606 is produced by a boosting control unit. Boost signal 606 combines with the voltage amplitude 612 to produce voltage 616. At 620 the resulting drive voltage Vd asserted on the OLED is plotted. At the higher temperature T1, drive voltage 624 results. At the lower temperature T2, drive voltage 626 results. A relationship between display luminance, boost voltage, and temperature enables boost voltages to be chosen in order to maintain for example a constant luminance output from the OLED pixels and correspondingly from the OLED display that does not vary with temperature. In one or more embodiments, a calibration is performed to measure display parameters, such as, but not limited to: luminance of a display and a corresponding drive voltage, as a function of temperature. In various embodiments, luminance of the display is measured as a function of a display drive parameter(s), and temperature. Thus, the relationship is given qualitatively as $L=f(P, T)$. Where L is luminance of a display. P is a display drive parameter, such as, but not limited to ΔV(DB), and T is temperature. The functional relationship is represented by "f" These calibration measurements are typically made apriori and are stored for use by the system (e.g., the boost control unit, etc.) in order to accomplish temperature compensation of the display.

In various embodiments, the described calibration provides apriori knowledge of display luminance as a function of a display drive parameter(s) and temperature so that the desired drive voltage needed for a given temperature can be generated in order to achieve a desired luminance from the display. The boost control unit (including logic and a processor), calibration data, and a measurement of current temperature are used to generate a magnitude of a boost signal, such as Vboost, needed to maintain constant OLED brightness. This is done across a range of temperatures of interest by, for example, the boost control unit 350. Different calibrations can be performed with respect to the system variables measured and quantities calculated. The example given above is provided only for illustration and does not limit embodiments of the invention.

Figure 6B:
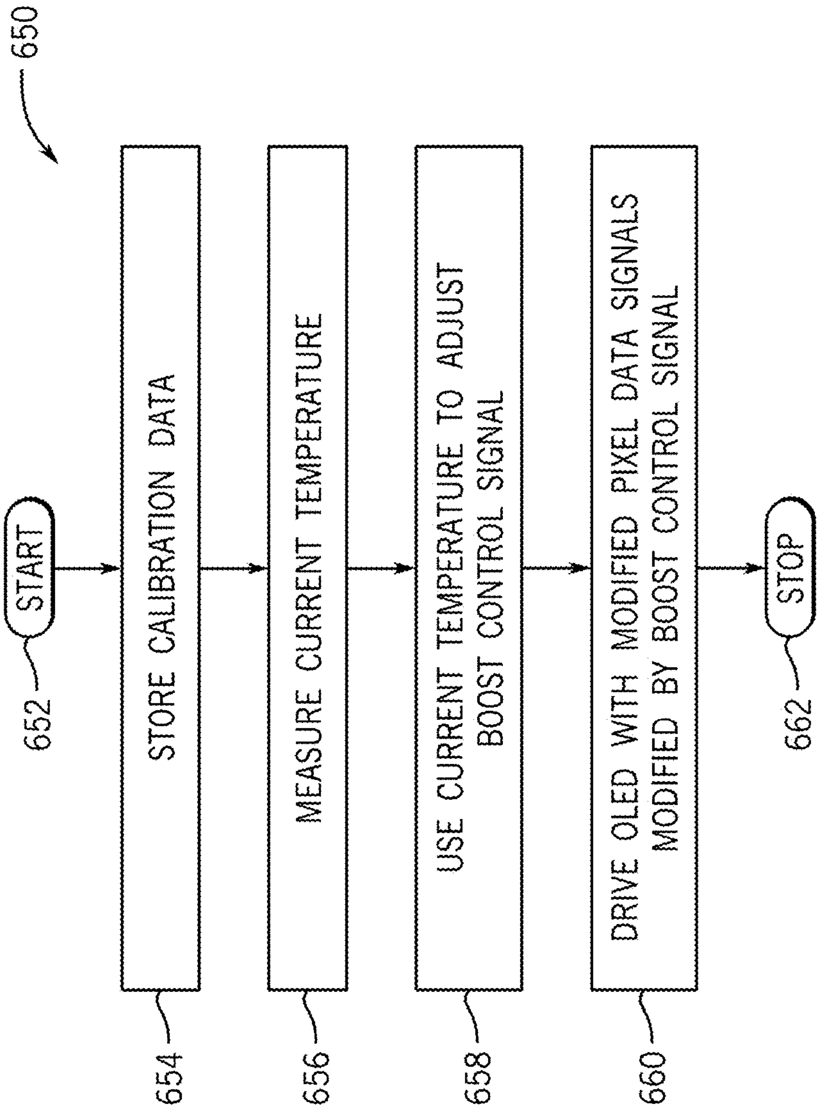
FIG. 6B illustrates a process for temperature compensation of an OLED display, according to embodiments of the invention.

FIG. 6B illustrates, generally at 650, a process for temperature compensation of an OLED display, according to embodiments of the invention. With reference to FIG. 6B, a process starts at a block 652. At a block 654 calibration data is stored. At a block 656 a measurement of current temperature is obtained with for example a temperature sensor 370 (FIG. 3). At a block 658 the measurement of current temperature from the block 656 is used to adjust a boost control signal. At a block 660 the OLED pixels in the OLED display are driven with modified pixel data signals. The boost control signal is used to form the modified pixel data signals. The process stops at a block 662.

Figure 1:
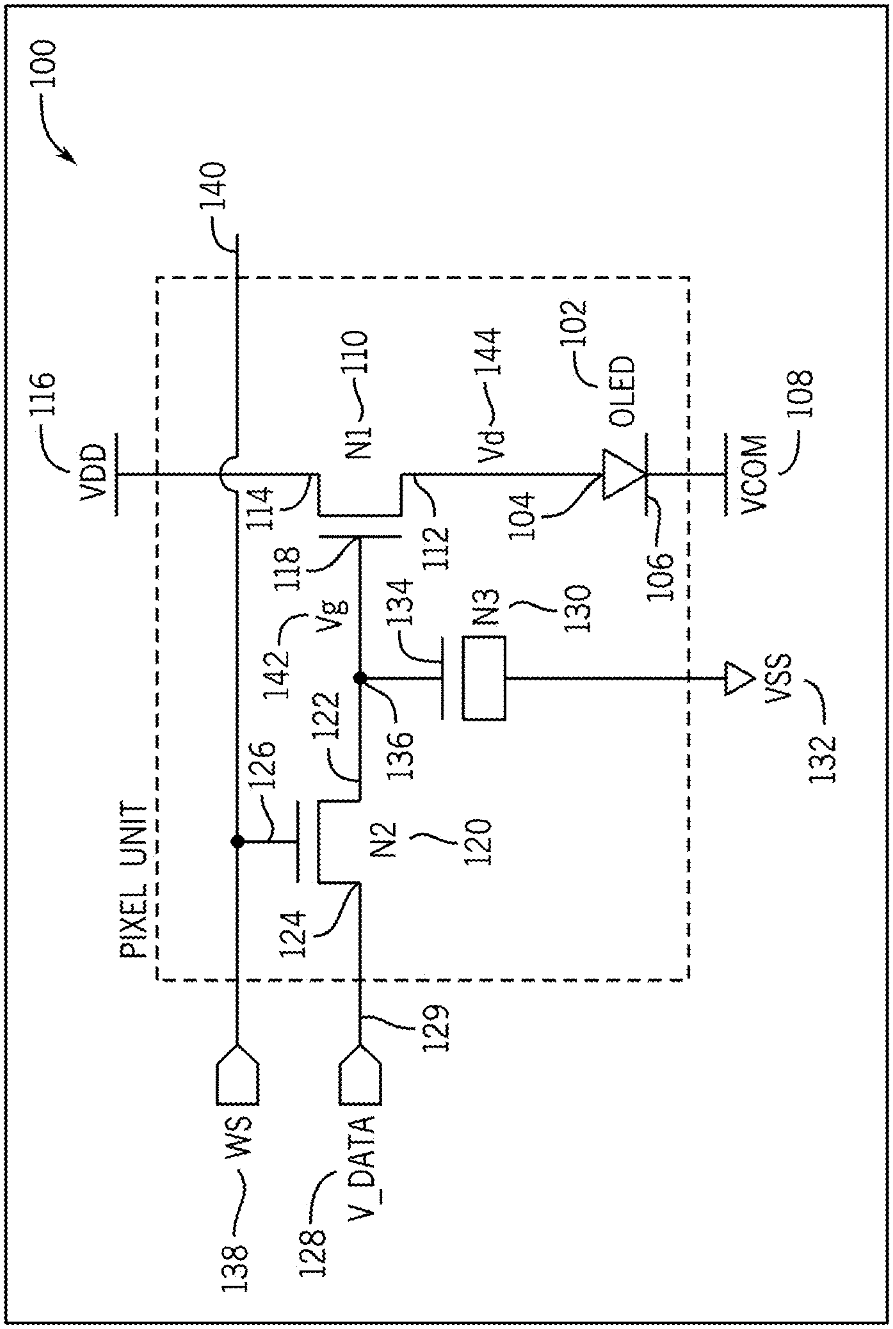
FIG. 1 illustrates an existing OLED pixel driving circuit.
Figure 2:
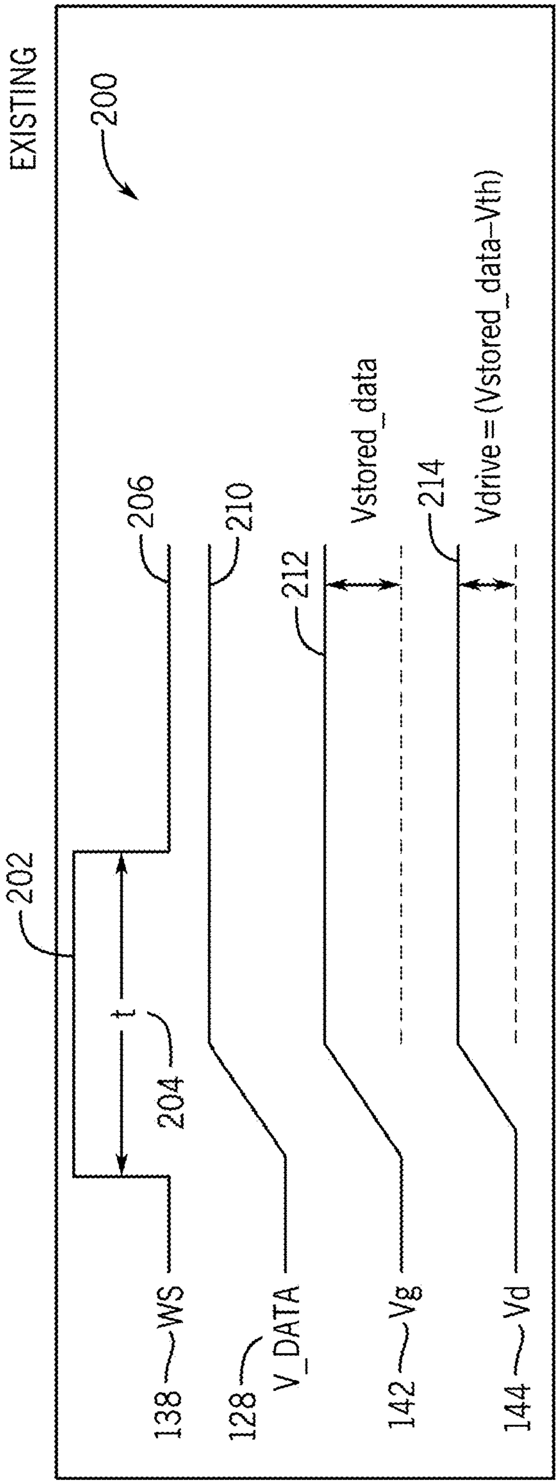
FIG. 2 illustrates a timing diagram for the existing OLED circuit of FIG. 1.
Figure 7A:
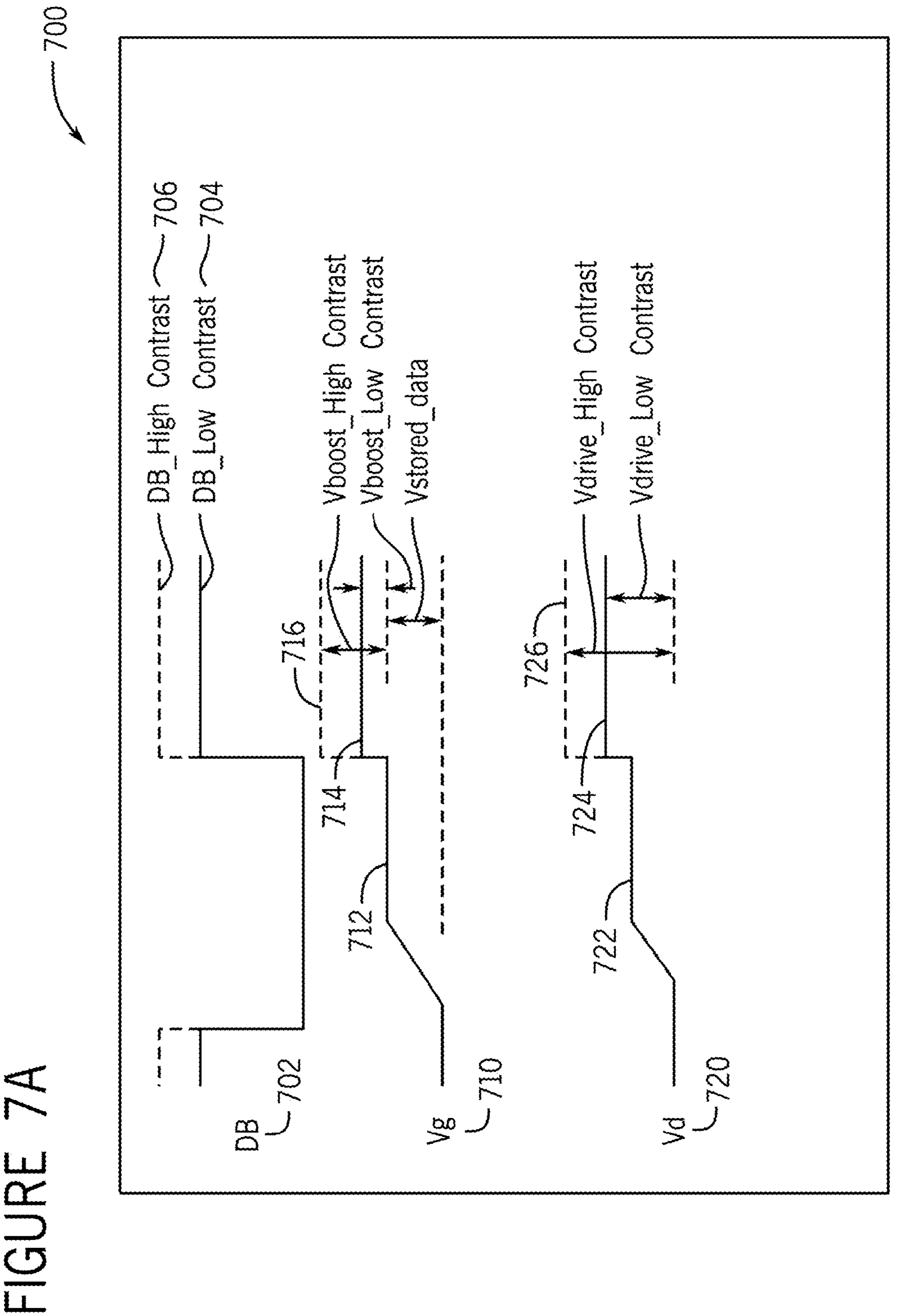
FIG. 7A illustrates another timing diagram for the OLED circuit of FIG. 3, according to embodiments of the invention.

FIG. 7A illustrates, generally at 700, another timing diagram for the OLED circuit of FIG. 3, according to embodiments of the invention. With reference to FIG. 7A, another example of using Vboost to increase the brightness and contrast ratio of an OLED pixel as well as an OLED display made from such pixels is described. By increasing the drive voltage to the OLED, through the use of Vboost, with the same Vcom, it is possible to increase the OLED brightness while maintaining a high contrast ratio. Note that a black level for a display will remain the same for different ΔV(DB) values, therefore brightness and contrast ratio increase or decrease together. Thus, in FIG. 7A, the curves labeled Low Contrast could also be labeled Low Brightness and the curves labeled High Contrast Curve could be labeled High Brightness. Note also, that unlike the existing methods, here Vcom is kept constant while OLED brightness is increased according to embodiments of the invention. Thus, the problems attendant upon reducing Vcom, as described above in conjunction with FIG. 1 and FIG. 2 are eliminated.

Note that different amounts of pixel brightness and contrast are obtained depending on a level of the signal 702 on the DB line. For the purpose of illustration only and with no limitation implied thereby, two signal levels 702 for the DB line 352 are illustrated in FIG. 7A. The corresponding voltages (Vg 342) asserted at the gate 318 of the drive transistor N1 are plotted at 710. The corresponding drive voltage (Vd 344) applied to the OLED 302 are plotted at 720. For example, a lower signal level, indicated as DB_Low_Contrast 704, elevates the Vstored_data voltage 712 to Vboost_Low_Contrast 714. Vboost_low Contrast 714 applied to the gate of the first transistor N1 310 results in a drive voltage Vdrive_Low Contrast 724 on the OLED 302. A higher level, indicated as DB_High_Contrast 706, elevates the Vstored_data voltage 712 to Vboost_High_Contrast 716. Vboost_High Contrast 716 applied to the gate 342 of the first transistor N1 310 results in a drive voltage Vdrive_High Contrast 726 on the OLED 302. Vdrive_High Contrast 726 produces a brighter OLED emission than does Vdrive_Low Contrast 724. Note that two different signal levels 702 on the DB line have been described. However, in various embodiments, any number of different signal levels can be generated by the boosting control unit for use at any increment of temperature.

Figure 7B:
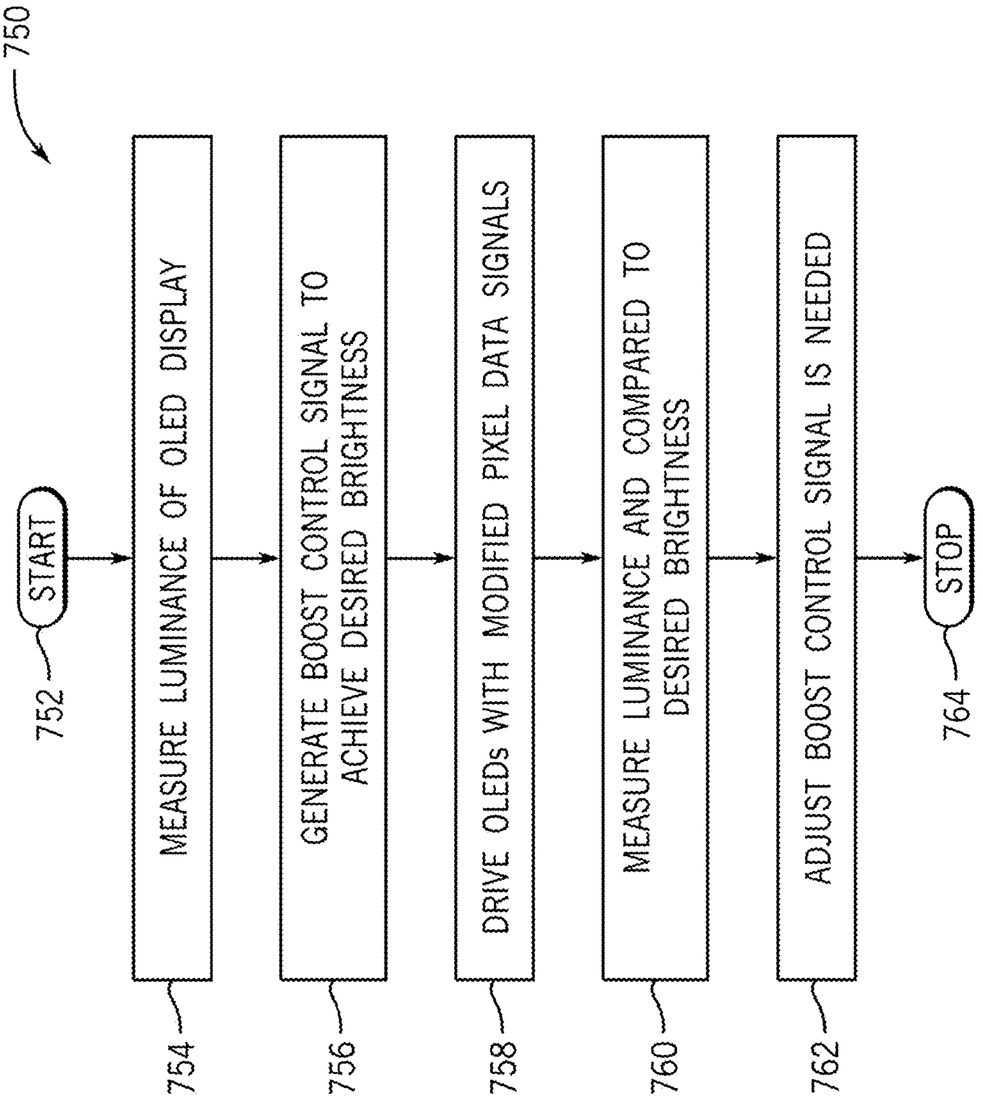
FIG. 7B illustrates a process for adjusting brightness of an OLED display, according to embodiments of the invention.

The calibration previously described can be used for the additional purposes of adjusting a brightness of an OLED display and/or to adjust an OLED display luminance to a selected brightness. FIG. 7B illustrates, generally at 750, a process for adjusting brightness of an OLED display, according to embodiments of the invention. With reference to FIG. 7B, a process starts at a block 752. At a block 754 a measurement of an OLED display's luminance is made with a luminance sensor. A luminance sensor can be configured with a boost control unit such as the boost control unit 350 in FIG. 3. At a block 756, the measured luminance, the calibration described above, control logic, and a processor are used in a boost control unit to generate a boost control signal ΔV(DB) that will achieve the desired brightness from the OLED display. At a block 758 the OLEDs of the OLED display are driven with pixel data modified by ΔV(DB). In various embodiments, optionally, the logic implemented as an algorithm that runs on a processor accepts an additional measurement of the display luminance at a block 760. At a block 762 the boost signal is adjusted if needed. The process stops at a block 764. Those of ordinary skill in the art will recognize that the process described in FIG. 7B can be configured to cycle continuously to maintain the luminance output of the OLED display at the desired value of luminance. The desired value of luminance can be a preset value or a value input by a user.

Figure 8:
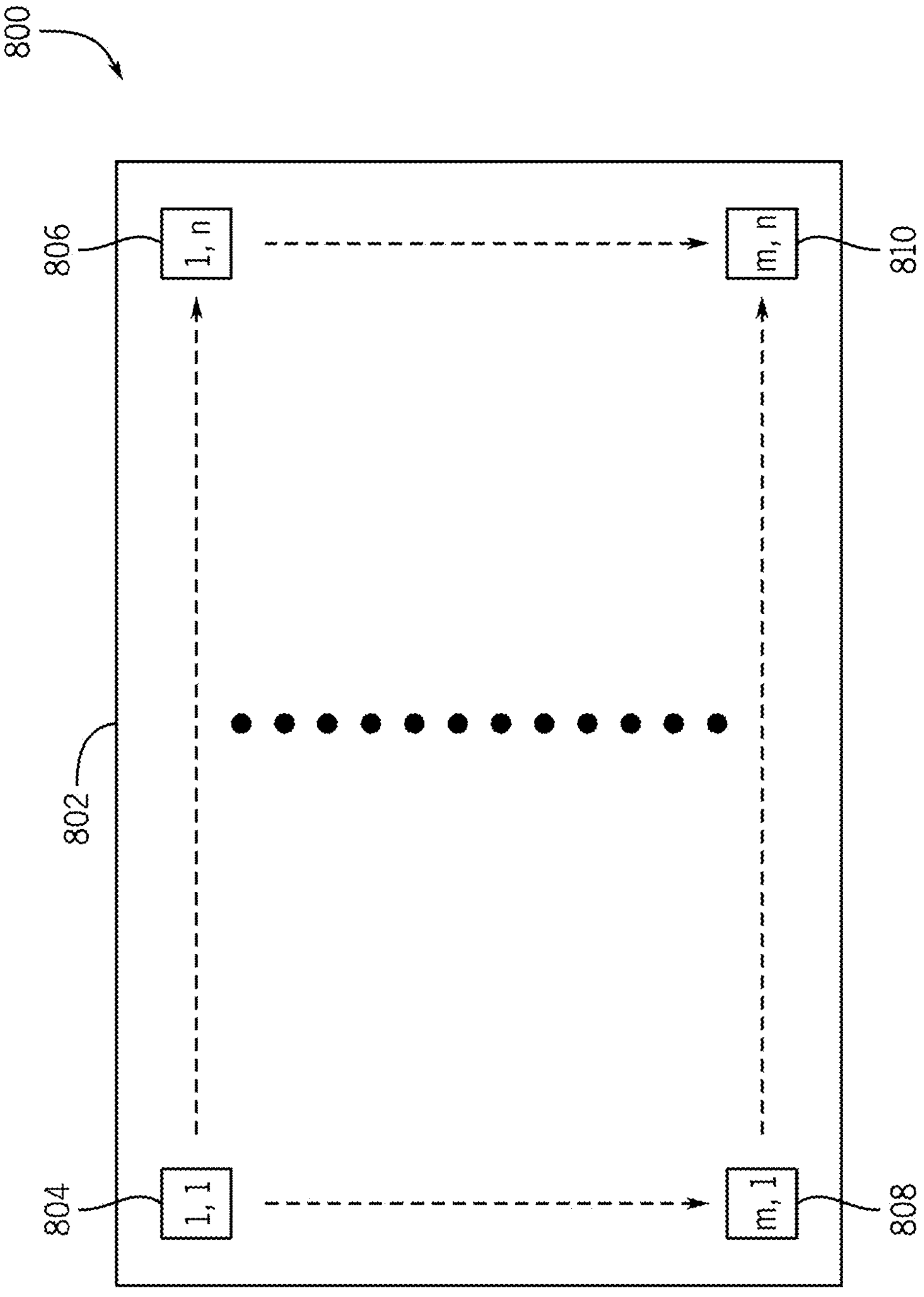
FIG. 8 illustrates an OLED display, according to embodiments of the invention.

FIG. 8 illustrates, generally at 800, an OLED display, according to embodiments of the invention. With reference to FIG. 8, a plurality of unit pixels, described in the preceding figures, are configured into an OLED display having m rows and n columns Pixel (m,n). Such a display is illustrated starting at the first pixel in the first row 804 (1, 1) extending to the last pixel in the first row of 806 (1, *n*), extending to the last pixel in the first column 808(*m*, 1), and extending to the pixel in the last row and the last column 810 (*m, n*). Intermediate values are not shown but are represented by dots in order to preserve clarity in the illustration.

Thus, in various embodiments, techniques for increasing a brightness, increasing or maintaining a contrast ratio, and providing for temperature compensation of AMOLED displays are described.

In various embodiments, the components of the AMOLED systems as well as the AMOLED systems described in the previous figures are implemented in an integrated circuit device, which may include an integrated circuit package containing the integrated circuit. In some embodiments, the components of systems as well as the systems are implemented in a single integrated circuit die. In other embodiments, the components of systems as well as the systems are implemented in more than one integrated circuit die of an integrated circuit device which may include a multi-chip package containing the integrated circuit. In some embodiments, an OLED display and the OLED display backplane circuitry are implemented on the same integrated circuit chip.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the embodiments of the present invention. It will be evident, however, to one of ordinary skill in the art that embodiments of the present invention may be practiced without these specific details. In some instances, well-known structures and devices are shown in block diagram form, rather than in detail, in order to avoid obscuring embodiments of the present invention. These embodiments are described in sufficient detail to enable those of ordinary skill in the art to practice the invention, and it is to be understood that other embodiments may be utilized and that logical, mechanical, electrical, and other changes may be made without departing from the scope of embodiments of the present invention.

Some portions of the description may be presented in terms of algorithms and symbolic representations of operations on, for example, data bits within a computer memory.

These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, waveforms, data, time series or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, mathematical expression, flow diagram or flow chart. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

Thus, embodiments of the invention can be used to provide a high brightness OLED display that has a luminance output that can be adjusted while preserving a contrast ratio of the display. In some embodiments, a dimmable high brightness OLED display is provided. Some non-limiting examples of OLED systems where embodiments of the invention are used are, but are not limited to; mobile phone, large screen displays, use in a near-to-eye (NTE) display or a headset computing device. Other embodiments of the invention are readily implemented in a wearable or a head wearable device of general configuration, such as but not limited to; wearable products such as virtual reality (VR), augmented reality (AR), mixed reality (MR); wristband, watch, glasses, goggles, a visor, a head band, a helmet, etc. or the like. As used in this description of embodiments, wearable encompasses, head wearable, wrist wearable, neck wearable, thus any form of wearable that can be applied to a user.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described but can be practiced with modification and alteration within the spirit and scope of the appended claims. The description is thus to be regarded as illustrative instead of limiting.

What is claimed is:

1. A method to boost a brightness of an Organic Light Emitting Diode (OLED) pixel, comprising:

transmitting a boost control signal to the OLED pixel on a boost control line;

combining the boost control signal and a pixel data signal at a node within the OLED pixel to obtain a composite drive signal; and driving the OLED pixel with the composite drive signal, the composite drive signal is elevated by the boost control signal relative to the pixel data signal, thereby increasing a brightness of the OLED pixel.

2. The method of claim 1, wherein a first storage element is used to store the composite drive signal within the OLED pixel, the first storage element is connected between the node and a common voltage reference.

3. The method of claim 2, wherein the first storage element is a capacitor.

4. The method of claim 2, wherein the first storage element is a storage transistor, the storage transistor has a source, a drain, and a gate, the source and the drain are connected together to the common voltage reference, the gate is connected to the node.

5. The method of claim 3, wherein a second storage element is connected between the boost control line and the node.

6. The method of claim 2, wherein a boosting control unit is used to generate the boost control signal.

7. The method of claim 1, wherein the driving utilizes a drive transistor, the drive transistor having a source, a drain, and a gate, the gate is connected to the node, the source is connected to a supply voltage, and the drain is connected to an anode of the OLED pixel.

8. The method of claim 1, wherein the pixel data signal is supplied to the node using a control transistor, the control transistor has a source, a drain, and a gate, the source is connected to the pixel data line, the drain is connected to the node, and a word select line is connected to the gate, in operation when a word select signal on the word select line goes high pixel data is supplied to the node.

9. An apparatus to boost a brightness of an Organic Light Emitting Diode (OLED) pixel, comprising:

an OLED, the OLED having an anode and a cathode, the cathode is connected to a common voltage reference; and a drive transistor, the drive transistor having a source, a drain, and a gate, the source is connected to a supply voltage, a supply voltage potential is greater than a potential of the common voltage reference, the drain is connected to the anode and the gate is connected to a node formed with a pixel data line and an output line of a boost control unit; in operation a voltage on the gate results from voltage at the node, which is a combination of voltages from the pixel data line and the output line resulting in a larger OLED emission than an emission that would result from just voltage from the pixel data line.

10. The apparatus of claim 9, further comprising:

a first storage element, the first storage element is connected between the node and a second common voltage refence.

11. The apparatus of claim 10, wherein the first storage element is a storage transistor, the storage transistor has a source, a drain, and a gate, the source and the drain are connected together to the second common voltage reference, the gate is connected to the node.

12. The apparatus of claim 10, wherein a second storage element is connected between the output line and the node.

13. A system for adjusting Organic Light Emitting Diode (OLED) display parameters, comprising:

a boost control unit, the boost control unit having an input, an output line, and control logic;

a display control unit, the display control unit to generate a word select signal to be output on a word select line;

a display pixel, the display pixel further comprising:

an OLED, the OLED having an anode and a cathode, the cathode is connected to a common voltage reference;

a drive transistor, the drive transistor having a source, a drain, and a gate, a control transistor, the control transistor having a source, a drain, and a gate, the source of the control transistor is connected to a pixel data line, the gate of the control transistor is connected to the word select line;

a storage element, the storage element having a first terminal and a second terminal, the second terminal is connected a second common voltage reference;

a node, the node connects the drain of the control transistor, the gate of the drive transistor, the first terminal, and the output line; wherein in operation the system has at least two states that occur in the following order:

State 1—the word select signal on the word select line goes high for a period of time causing a voltage on the pixel data line to be asserted at the node, light is emitted from the OLED at a first level;

State 2—after the period of time, the word select signal goes low, then a boost control signal (DB) goes high on the output line which causes a voltage at the node to increase above the voltage on the pixel data line, thereby increasing an illumination of light from the OLED to a second level, the second level is greater than the first level.

14. The system of claim 13, further comprising:

a set of calibration data, the set of calibration data is obtained by a priori measurements over a range of temperature, the set of calibration data provides a boost control signal level for each temperature in the range of temperature, needed to maintain a constant luminance output from the OLED display over the range of temperature; and a temperature sensor, the temperature sensor is configured to output a measurement of temperature to the boost control unit, the control logic is configured to use the set of calibration data and the measurement of temperature to provide the boost control signal, the boost control signal enables the luminance output from the OLED display to remain constant over the range of temperature.

15. The system of claim 13, further comprising:

a luminance sensor, the luminance sensor is configured to measure luminance output from the OLED display, logic is configured to perform the following functions:

(1) lower a magnitude of the boost control signal if the measured luminance output is greater than a desired display brightness level; and (2) increase a magnitude of the boost control signal if the measured luminance output is less than the desired display brightness level.

16. A method to compensate Organic Light Emitting Diode (OLED) display brightness for variations in temperature, comprising:

storing a calibration of brightness from an OLED display, the calibration was performed a priori as a function of temperature, the calibration establishes values for OLED pixel drive information over a range of temperatures that are needed to maintain a desired constant luminance output from the OLED display;

receiving a measurement of current temperature;

adjusting an output signal of a boost control unit based on the calibration and the measurement; and driving a plurality of OLED pixels of the OLED display with modified pixel data signals, wherein, at each pixel of the plurality, an output signal of the boost control unit is combined with a pixel data signal to produce modified pixel data signals, the modified pixel data signals are applied to the plurality thereby compensating a luminance output from the OLED display for the current temperature.

17. The method of claim 16, wherein the modified pixel data signals are applied to gates of drive transistors in the OLED display.

18. The method of claim 16, wherein a temperature sensor is used for the receiving.

19. A method to adjust a brightness of an Organic Light Emitting Diode (OLED) display, comprising:

generating a boost control signal for a plurality of OLED pixels in the OLED display;

combining, at each pixel of the plurality, the boost control signal and a pixel data signal to obtain a composite drive signal for each pixel of the plurality; and driving each pixel of the plurality with its composite drive signal, an amplitude of each composite drive signal is elevated by the boost control signal, thereby the brightness of the OLED display is adjusted.

20. The method of claim 19, wherein each OLED pixel of the plurality has an anode and a cathode, and each OLED pixel of the plurality has a drive transistor, the drive transistor has a drive transistor gate, each composite drive signal is applied to its drive transistor gate.

21. The method of claim 20, further comprising:

receiving an input, the input is associated with a desired display brightness level, the generating utilizes the input to set a magnitude of the boost control signal.

22. The method of claim 21, further comprising:

receiving a measurement of luminance from the OLED display, a luminance sensor is used for the measurement, the generating further comprising:

lowering a magnitude of the boost control signal if the measurement is greater than the desired display brightness level; and increasing a magnitude of the boost control signal if the measurement is less than the desired display brightness level.

* * * * *